United States Patent [19]
Watrobski et al.

[11] Patent Number: 5,943,588
[45] Date of Patent: *Aug. 24, 1999

[54] METHOD OF MANUFACTURING AND USING ALIGNMENT MARKS

[75] Inventors: Kenneth Watrobski, Shingle Springs; Ken H. Faulk, Folsom, both of Calif.

[73] Assignee: Intel Corporation, Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/891,300

[22] Filed: Jul. 10, 1997

Related U.S. Application Data

[62] Division of application No. 08/777,602, Dec. 31, 1996.

[51] Int. Cl.$^6$ ........................................... H01L 21/76
[52] U.S. Cl. ........................................................ 438/401
[58] Field of Search .................................... 438/401, 462

[56] References Cited

U.S. PATENT DOCUMENTS

| | | | |
|---|---|---|---|
| 3,875,414 | 4/1975 | Prior | 250/492.1 |
| 4,884,122 | 11/1989 | Eichelberger et al. | |
| 5,310,691 | 5/1994 | Suda | 438/359 |
| 5,316,966 | 5/1994 | Van Der Plas et al. | 438/401 |
| 5,332,470 | 7/1994 | Crotti | 216/2 |
| 5,346,858 | 9/1994 | Thomas et al. | 438/669 |
| 5,468,580 | 11/1995 | Tanaka et al. | 430/22 |
| 5,546,279 | 8/1996 | Aota et al. | 361/749 |
| 5,578,519 | 11/1996 | Cho | 438/401 |
| 5,633,103 | 5/1997 | Demarco et al. | 430/5 |
| 5,700,732 | 12/1997 | Jost et al. | 438/401 |

*Primary Examiner*—Charles Bowers
*Assistant Examiner*—Craig Thompson
*Attorney, Agent, or Firm*—Blakely, Sokoloff, Taylor & Zafman

[57] ABSTRACT

A method and apparatus for using alignment marks to locate buried structures in integrated circuits is provided. An alignment mark is used to locate a circuit area to be operated on. Underlying features of the circuit area are located based on the known location of the alignment marks. These underlying features are then operated on.

20 Claims, 7 Drawing Sheets

METHOD OF MANUFACTURING AND USING ALIGNMENT MARKS

FIELD OF THE INVENTION

This is a divisional of application Ser. No. 08/777,602 filed Dec. 31, 1996.

The present invention relates to integrated circuit manufacturing, and more specifically, to locating buried structures in integrated circuits.

BACKGROUND OF THE INVENTION

As integrated circuits (ICs) increase in complexity, the sizes of underlying IC structures decrease, and the number of layers in the IC increases. This makes the location of underlying structures in ICs more and more difficult. Although the circuit is initially simulated using software, the actual circuit needs to be tested in a number of cases. Such circuit testing may require access to the underlying structures of the circuit.

For example, circuit testing is used when the circuit is debugged, initially during ramp up in production, and in failure analysis. In these cases, individual circuits are analyzed using analytical tools which may include ion mill, electron beam (e-beam), and secondary electron emission (SEM) devices. Such analysis requires finding test points or device signal lines underneath a planarized IC surface. Locating these structures is problematic. Today's techniques generally use particle beam imaging devices, which display only the topography of the die, and not the underlying layers.

In the prior art, locating such test points was wholly dependent on the accuracy of location tools. The top of the die displayed is virtually featureless. FIG. 1 illustrates the only features that can be seen via particle beam imaging devices, the surface metal lines 100. Surface metal lines 100 are generally power lines and global signal lines. The size of an entire circuit area 110 to be located is quite small with respect to the metal lines 100. Additionally, the size of test point 120 or underlying signal line that needs to be located is even smaller. These surface metal lines 100 do not give enough resolution to help find underlying test points 120 or signal lines. Therefore, in order to locate these underlying structures, such as test point 120, in the prior art, the die is placed on a high accuracy and high resolution stage inside an ion mill. The stage is the staging area inside the ion mill or equivalent apparatus, which moves the die to the proper location. This stage moves the die under a high resolution microscope. The movement of the stage must be extremely accurate and high resolution, in the order of fractions of microns, in order to locate the sought features accurately. The accuracy and resolution required for such tools is beyond the scope of most current tools. Any tools that can manipulate the die with such accuracy are extremely expensive. Additionally, even with such high accuracy tools, locating specific signal lines is highly dependent on operator skill and flawless execution. In many applications, the prior art method success rate was approximately 10–20% in locating metal 1 features in a four layer metal device.

The underlying features have to be located accurately in order to test, correct, or adjust them. For example, in the ion mill a buried metal 1 line may be disconnected from or connected to another metal line. In order to adjust such a metal line, without short circuiting it or otherwise interfering with nearby circuit structures, the buried structure has to be located accurately.

Therefore, it can be seen that a simple and highly accurate location method for locating underlying lines or test points in an integrated circuit is needed.

SUMMARY OF THE INVENTION

A method for precision alignment for an integrated circuit is provided using one or more alignment marks. In one embodiment an alignment mark is created by depositing a surface metal layer and etching back the surface metal layer, producing metal lines and one or more alignment marks on or about those metal lines.

The alignment marks are arranged in a pattern on the surface of integrated circuit. The integrated circuit is then aligned based on the alignment mark, and underlying features of the integrated circuit are located based on the alignment mark.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENT

A method and apparatus for aligning a device to accurately locate and edit underlying structures in integrated circuits is described. In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid obscuring the present invention.

The present invention discloses a process for depositing an alignment mark. One embodiment will be described with reference to a surface metal layer (M4). It should be noted, however, that this process can be used on any layer. For example, the alignment marks may be implemented on a polysilicon layer. The processing steps described below may be applied to any layer.

Manufacturing of the Alignment Marks

Figure 1:
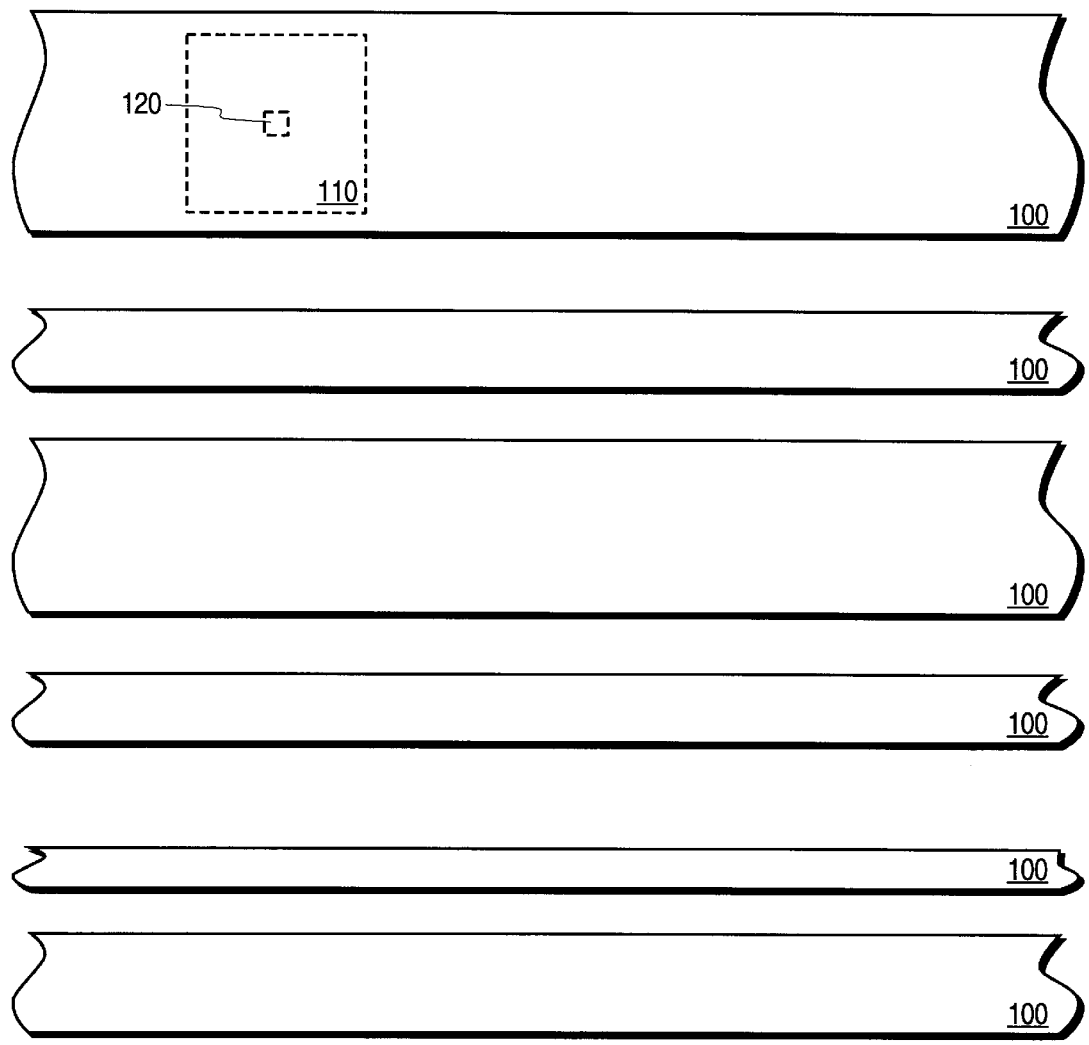
FIG. 1 is an illustration of a top view of an integrated circuit without alignment marks.
Figure 2A:
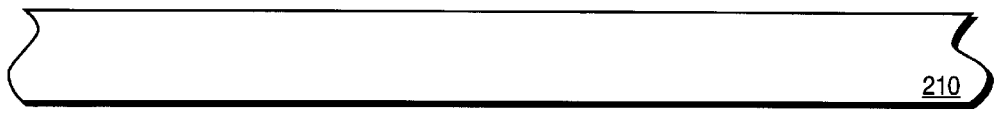
FIG. 2A is a cross-sectional view of a top layer insulating layer.
Figure 2B:
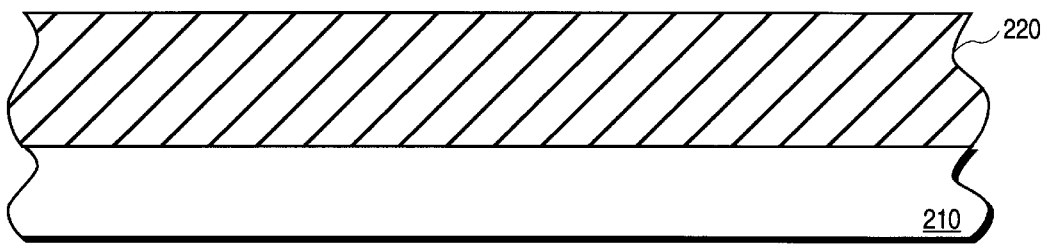
FIG. 2B is a cross-sectional view of a metal layer deposited over the insulating layer.
Figure 2C:
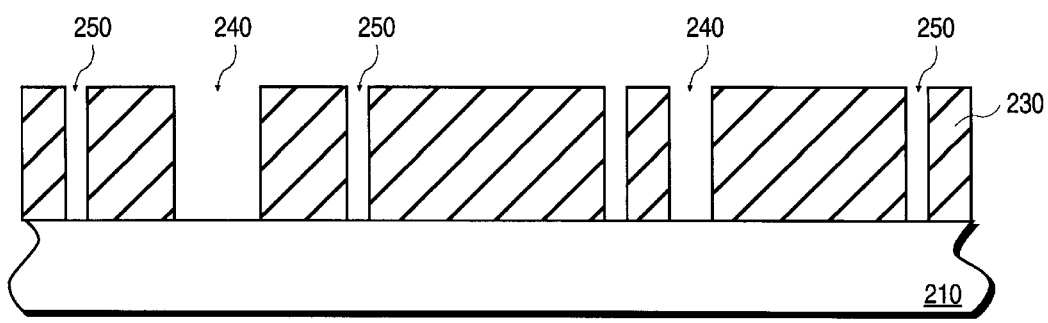
FIG. 2C is a cross-sectional view of the etched back metal layer showing metal lines and the alignment marks of the present invention.

FIGS. 2A–2C illustrate one embodiment of a manufacturing process for the alignment marks of the present invention. FIGS. 2A–2C illustrate the integrated circuit manufacturing process after the process is almost complete—after the top insulating layer has been deposited. The methods used to manufacture the underlying layers in the integrated circuit do not affect the present invention, therefore, any methods known in the art may be utilized. In one embodiment the underlying integrated circuit is manufactured using conventional techniques and methods, known in the art.

FIG. 2A is a cross-sectional view of an insulating layer 210. The insulating layer 210 is at the top level of manufacture, having only one more metal layer underneath. Although the configuration below the insulating layer 210 is not shown, there may be a number of metal, semiconductor, or other layers underneath the insulating layer 210. In one embodiment the insulating layer 210 is silicon dioxide.

FIG. 2B is a cross-sectional view of a metal layer 220 deposited over the insulating layer 210. The metal deposition is accomplished using conventional metal deposition techniques. In one embodiment the metal 220 is deposited onto the insulating layer 210 using conventional chemical vapor deposition (CVD) techniques. The metal layer 220 may also be deposited by radio frequency (RF) sputtering, magnetron sputtering, bias sputtering, evaporation, or any other technique known in the art.

A photoresist is applied to the entire metal layer 220. In one embodiment, a positive photoresist is utilized. A mask is aligned over the wafer surface. The positioning of this mask is done by conventional methods. In one embodiment the mask includes the location of a plurality of metal lines and the location of the alignment marks of the present invention. The wafer is then exposed, using conventional techniques. The wafer is then etched. The present invention etches the metal 230 using conventional methods. In one embodiment, the metal layer 220 is etched using reactive ion etching, which is well known in the art. However, alternative methods known in the art may be utilized, including chemical etching, plasma etching, and physical sputtering or ion beam milling.

FIG. 2C is a cross-sectional view of the etched back metal layer showing metal lines 230 and the alignment marks 250 of the present invention. The etchback creates a number of metal lines 230, separated by gaps 240. In the present invention, the etchback also creates alignment marks 250. These alignment marks 250 are etched into the metal layer in the same step as the etchback of the metal layer.

In etching back the metal, the location of the alignment marks are on the mask. In this way, when the metal lines are etched, the alignment marks are etched into the metal layer as well. Thus, forming the alignment marks does not require any extra processing steps. Forming the top metal lines 230 and the alignment marks 250 of the present invention may be accomplished by any other known means of forming surface metal lines 230.

Figure 3:
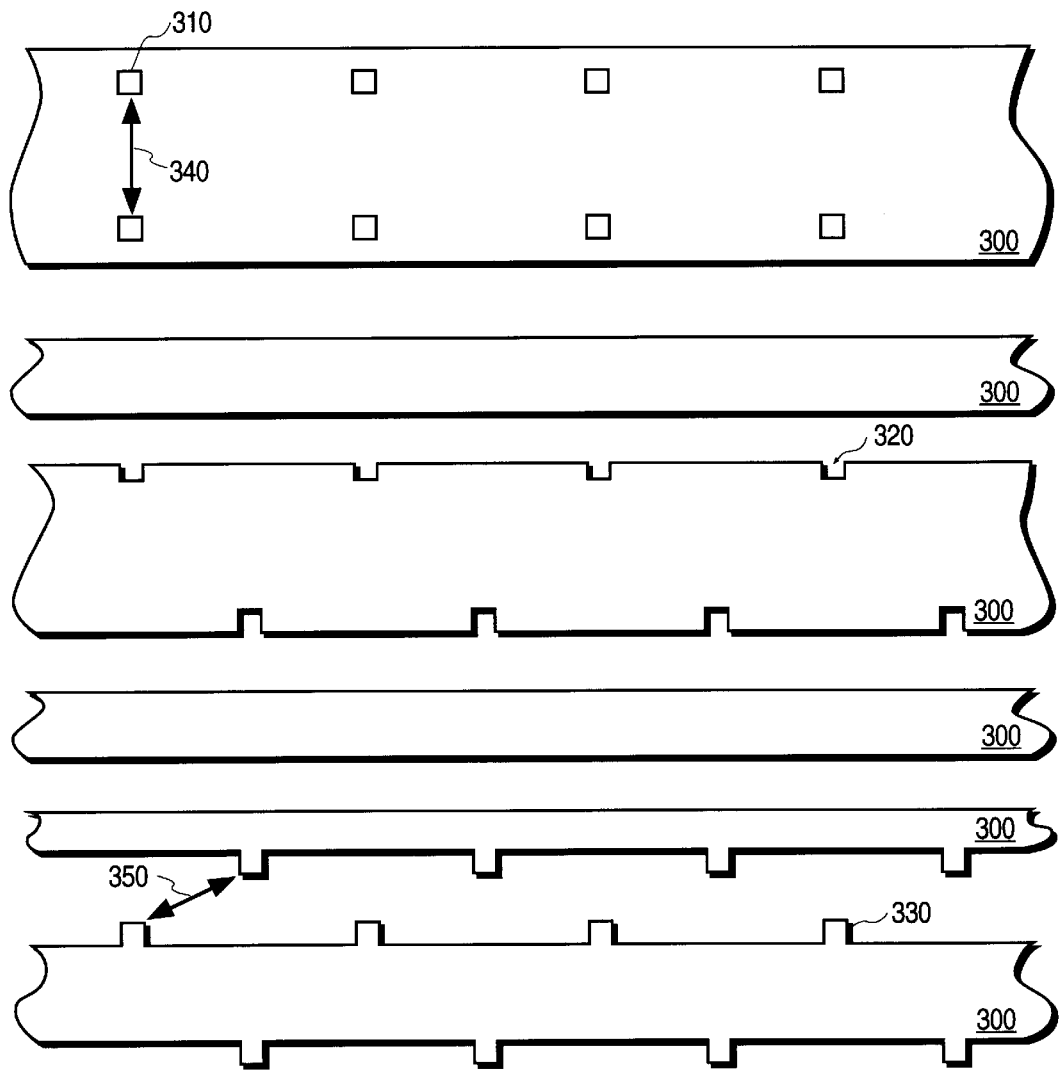
FIG. 3 is an illustration of a top view of a circuit area with the alignment marks of the present invention.

FIG. 3 illustrates a top view of a completed integrated circuit with a variety of types of the alignment marks of the present invention. In one embodiment the metal lines 300 are the typical global signal and power lines implemented in a top level metal layer. FIG. 3 includes three embodiments of the alignment mark 310, 320, 330 of the present invention. The configurations of the three types of alignment marks are described in more detail below.

In one embodiment the alignment marks 310, 320, 330 are arranged in a regular square pattern 340. In another embodiment successive rows of alignment marks are shifted with respect to each other, producing offset alignment marks 350. In one embodiment the offset alignment marks 350 are shifted by one half of the distance between alignment marks.

The minimum spacing of alignment marks is dictated by the accuracy of the stage being used. The stage is the staging area inside the ion mill or equivalent apparatus, which moves the die to the proper location. If the alignment marks are too close together, the relationship of a specific alignment mark with the underlying feature(s) may be wrongly determined. For example, if there are two alignment marks which are extremely close, one mark may be mistaken for another, thus wrongly identifying the location of an underlying feature. Therefore, placing alignment marks too close together can cause problems.

A second limiting factor on the placement of alignment marks is resistivity. Two of the types of alignment marks, the hole 310 and the notch 320, take away from the width of the metal line. Conductivity is inversely related to width of metal lines, and since the addition of the alignment marks reduces the effective width of the metal line in this cases, the resistivity of the metal line increases with the addition of alignment marks. Therefore, the alignment marks have to be placed sufficiently far apart so as not to cause an increase in resistivity which may affect the function of the metal lines on which the alignment marks are placed. The offset alignment marks 350 have less of an impact on conductivity. The reduction in the conductivity caused by offset alignment marks 350 is not additive. Thus, instead of having a certain area on metal line reduced by two alignment marks, each slice only has one alignment mark, and thus a smaller increase in resistivity. This limitation does not apply to the third type of alignment mark, the tab 330, because the tab 330 does not take away from the width of the metal line.

The maximum spacing of alignment marks is only limited by the accuracy and resolution of the stage inside the ion mill or other analytical tool used. Having the alignment marks too far apart reduces the accuracy of location and leads to the same problems described above with respect to the prior art. In one embodiment, the distance between alignment marks 340 is 20 $\mu$m.

Figure 4A:
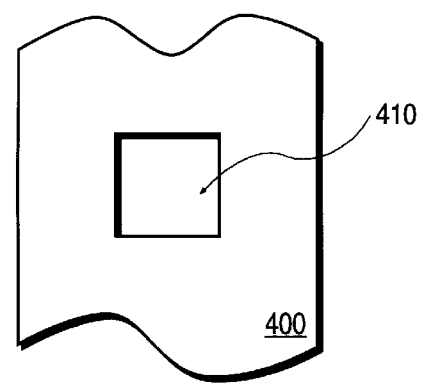
FIG. 4A is an illustration of a top view of one embodiment of the alignment mark of the present invention.

FIG. 4A illustrates the first embodiment of alignment mark 410 in a metal line 400, the hole 410. The hole 410 is etched within a metal line 400. In one embodiment, the hole 410 is square with a height of 2 $\mu$m and a width of 2 $\mu$m. However, the hole 410 may be any geometric figure. The size of the hole 410 may be reduced and is limited only by the minimum size of features which can be manufactured in the manufacturing process utilized. The maximum size of the hole 410 is limited by the physical limitations of metal lines, described above. The hole 410 has to be sufficiently small so as not to cause an excessive increase in electromigration or resistivity of the metal line. Having a hole 410 which is too large could decrease the performance of the integrated circuit. If the hole 410 is properly sized, it does not affect the integrated circuit performance in a significant way.

Figure 4B:
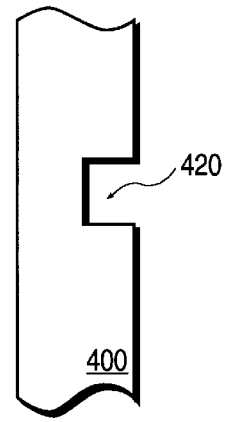
FIG. 4B is an illustration of a top view of an alternate embodiment of the alignment mark of the present invention.

FIG. 4B illustrates the second type of alignment mark, the notch 420. The notch 420 is a small notch in the side of the metal line 400. The limitations on the size of the notch 420 are the same as described above with respect to the hole 410. The maximum size of the notch 420 is limited by the physical rules regarding electromigration and resistivity. The minimum size of the notch 420 is only limited by the accuracy of the process used to make the notch. In one embodiment of the present invention the notch is 0.4 $\mu$m wide and 1.44 $\mu$m long.

Figure 4C:
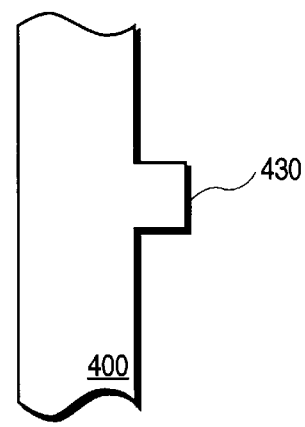
FIG. 4C is an illustration of a top view of an alternate embodiment of the alignment mark of the present invention.

FIG. 4C illustrates the third type of alignment mark, the tab 430. The tab 430 is a metal extrusion from the metal line 400. The minimum size of the tab 430 is limited by the accuracy of the process used to make it. The maximum size of the tab 430 is limited by the distance between the metal lines 400. The distance between the tab 430 and the next metal line may not be smaller than the minimum distance between metal lines. Such a minimum distance is dictated by the danger of short circuit across metal lines, and electromigration, as is well known in the art. In one embodiment, the tab 430 is 0.4 µm wide and 1.44 µm long.

The depth of all of the alignment marks 410, 420, 430 is approximately the height of the metal line 400 on which the alignment marks 410, 420, 430 are located. This is a result of using the last stage processing of the metal to create the alignment marks 410, 420, 430 as discussed above. In other embodiments, the depth of the alignment mark 410, 420, 430 may be less than the height of the metal line 400.

The type of alignment mark 410, 420, 430 used depends on a variety of factors. The increased resistivity of the metal lines 400, as a result of the alignment marks 410, 420, 430 is a factor. If the increased resistivity would be a problem, affecting the functioning of the metal line 400, a notch 420 is preferred because of its smaller width. If even the notch 420 would increase resistivity to unacceptable levels, the tab 430 may be utilized. Typically, a tab 430 is preferred for narrower metal lines 400, while the hole is preferred for wide lines 400. The width of the metal lines 400 is a further factor. If a metal line 400 is significantly wider than the determined distance between alignment marks 410, 420, 430, holes are preferred. Using holes 410, 420, 430, a number of alignment marks 410, 420, 430 may be placed within the body of the metal line 400. Tabs 430 and notches 420 can only be appended to the sides of a metal line 400. Therefore, a hole 410 is the only type of alignment line which can be positioned within a metal line 400.

The distance between metal lines 400 is a further factor. If the lines 400 are closely spaced a tab 430 may not be utilized. Because tabs 430 extend from the metal line 400, the addition of the tab 430 may decrease the distance between metal lines 400 to an unacceptably small distance. The minimum distance between metal lines 400 on an integrated circuit is limited by tool accuracy. Thus, a tab 430 can not be used if adding the tab 430 to the metal line 400 would decrease the distance between the tab 430 and the next metal line 400 to dimensions that can not be accurately implemented.

Electromigration is another factor. Electromigration occurs when a high current is carried over a long distance on a thin metal line 400. The current sets up an electric field in the metal line 400, decreasing from the input side to the output. Heat generated by the flowing current sets up a thermal gradient along the lead. Metal lines 400 cannot become so thin that electromigration would result in separation of the metal line 400, and thus opening a circuit. Thus, if electromigration is a problem, a smaller notch 420 or tab alignment mark 430 would be preferable.

All of these factors have to be considered when selecting the appropriate type of alignment mark 410, 420, 430 for a circuit. When alignment marks 410, 420, 430 are properly selected for a circuit, the presence of the alignment mark 410, 420, 430 does not noticeably affect the electrical characteristics of the circuit.

Use of the Alignment Marks

Figure 5:
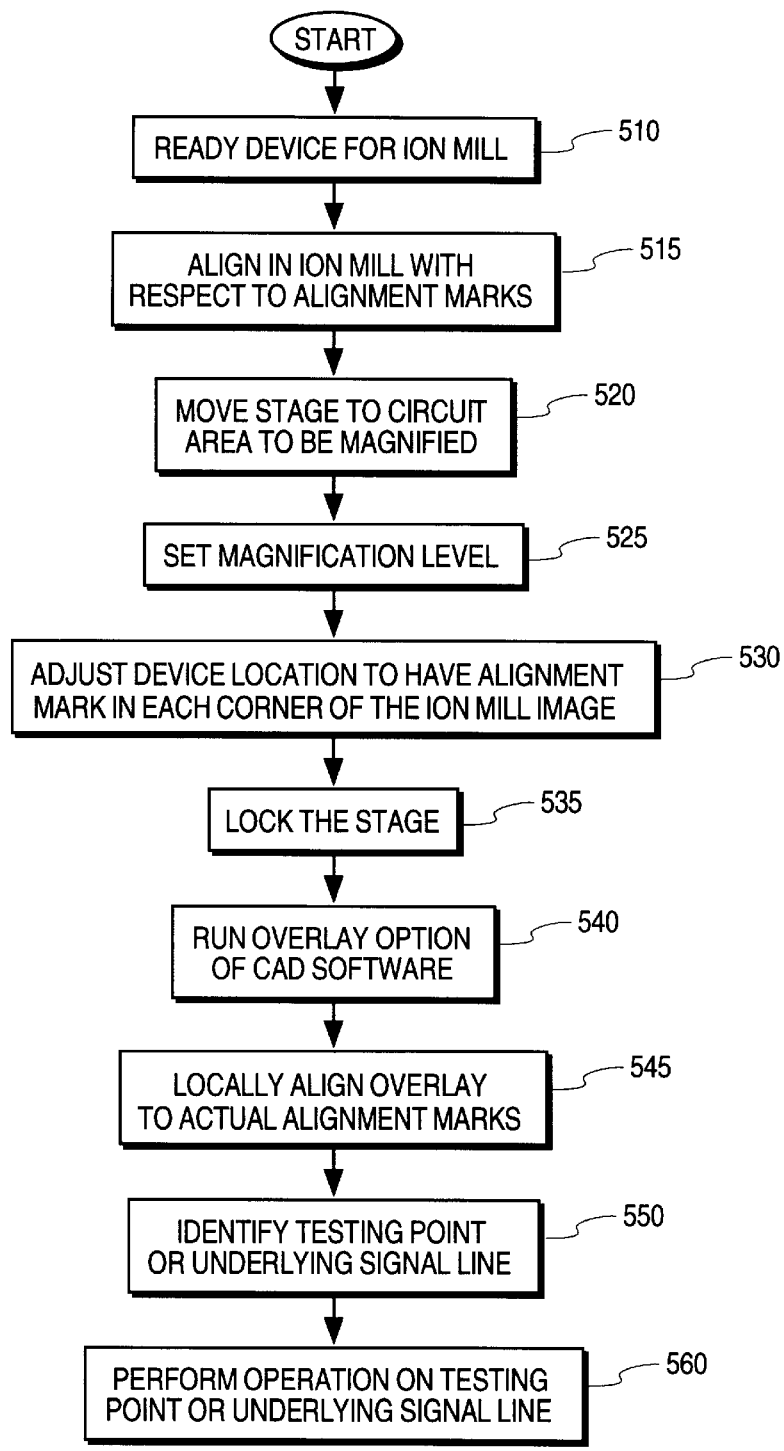
FIG. 5 is a flowchart of the use of the alignment marks of the present invention.

FIG. 5 is a flowchart of the process of using the alignment marks of the present invention for locating certain points on a planarized integrated circuit area. The flowchart is described for an ion mill and for alignment marks which are placed 20 µm apart in a square pattern. However, it can be appreciated that the same technique may be applied with a different device or with alignment marks which are differently placed.

At block 510, the circuit area is readied for the ion mill. Depending on which stage of processing the technique is applied, this means a number of different steps. In one embodiment, a scratch protection is removed from the die. The scratch protection layer is a thick planarized layer of scratch protectant with no true electrical characteristics. It is not necessary to remove this layer. Removing the scratch protection layer is accomplished with a UV exicimer laser, or by other techniques known in the art. In one embodiment, the passivation layer is not removed at this stage. The method of readying a die for the ion mill is well known in the art.

At block 515, the ion mill is stage aligned, using the alignment marks of the present invention. Stage alignment consists of placing the die on the stage of the ion mill, and moving the stage to the general area on which the ion mill will operate. The stage is the staging area inside the ion mill or equivalent apparatus, which moves the die to the proper location. The alignment marks can be readily discerned by the ion mill, since they are detectable on the surface metal layer.

At block 520, the stage is moved to the specific circuit area to be examined or modified. The ion mill is used to access, probe or modify specific areas on a circuit. In one embodiment, a computer assisted design (CAD) software is used to identify the circuit area and control the ion mill stage movement. In one embodiment the CAD software sold by Knights Technology™ of Sunnyvale, Calif. is used. However, any other navigation software may be used.

At block 525, the magnification is set. The magnification level used may vary depending on the technology. In one embodiment, the magnification is set at 10,000 times to allow a relatively clear view of the underlying structures, as described below. In one embodiment, with a 10,000 magnification, after complete alignment the screen has four alignment marks, one in each corner of the screen.

Figure 6:
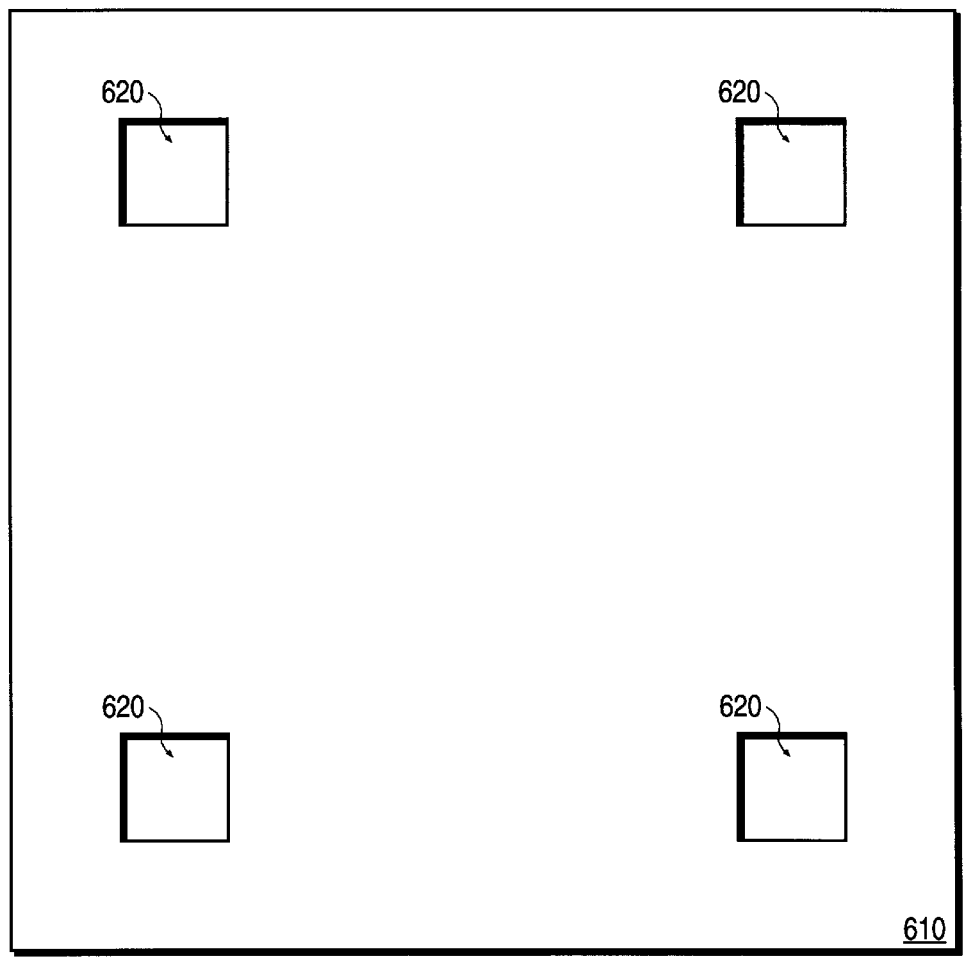
FIG. 6 is an illustration of a circuit area with the alignment marks of the present invention.

At block 530, the circuit area location is adjusted. In one embodiment, there is an alignment mark in each corner of the ion mill image. A view of the ion mill display at this point is illustrated in FIG. 6. It must be noted that a different number of alignment marks may be used, without changing the present technique. In that instance, there may be an alignment mark in two corners, or one alignment mark in the center of the ion mill image. However, one embodiment utilizes four alignment marks, one in each corner of an ion mill image. This compensates for die tilt and provides a very accurate method of locating underlying features of the integrated circuit.

Returning to FIG. 5, at block 535, the stage is locked. This is done in order to prevent further movement of the device during the later processing steps. The circuit area on which the ion mill is to operate is now fully aligned and located in the correct area of the ion mill.

At block 540, an overlay option is run. The overlay option displays an illustration of the underlying structures of the circuit area on the CAD software. In this way, the viewer can visually identify areas of interest. This is not necessary for the practice of the invention, but it provides a visual image of the underlying structures. In one embodiment of the present invention, a Knights CAD software package referred to above, is used to run the overlay option.

Figure 7:
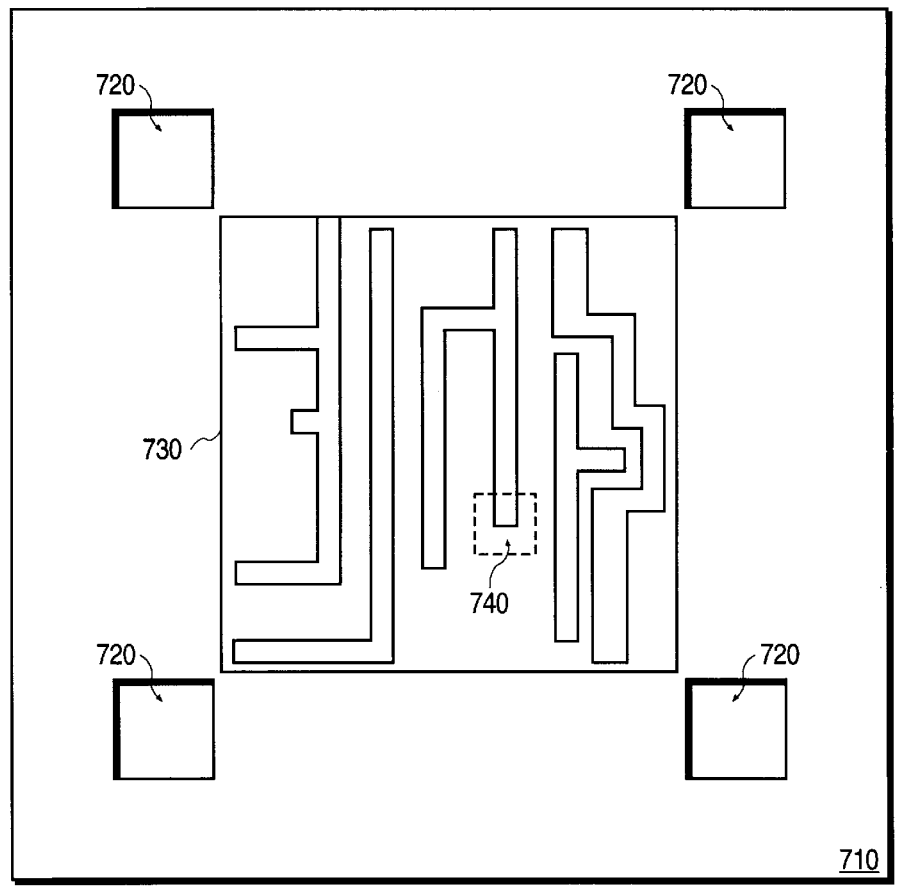
FIG. 7 is an illustration of a circuit area with a CAD overlay and the alignment marks of the present invention.

At block 545, the overlay is locally aligned with the four corner alignment marks. The initial overlay, which includes visual images of the alignment marks, is adjusted to correspond with the actual locations of the alignment marks, as seen through the ion mill image. FIG. 7 illustrates the fully aligned device with the CAD overlay image of the underlying structures as displayed by the CAD software.

Returning to FIG. 5, at block 550, the testing point or underlying signal line to be operated on is identified. This is illustrated in FIG. 7, as the box 720. And finally, at block 560, the device operation is performed on the fully aligned circuit area. Such a device operation may be cutting or reconnecting metal lines or alternative operations known in the art.

FIG. 6 is an illustration one embodiment of the circuit area 610 of the present invention, as seen through the ion mill image. The alignment marks 620 are located in each corner of the screen image. Alternately, there could be just one alignment mark 620. The present invention uses at least one alignment mark, which need not be displayed within the ion mill image.

FIG. 7 is an illustration of the aligned circuit area of the present invention, with the aligned CAD overlay. The circuit area 710 of the device is shown on the screen. The alignment marks 720 are located one in each corner of the circuit area 710. An overlay of the underlying structures 730 of the circuit area 710 is displayed by the CAD program, based on the known layout of the circuit area 710, with respect to the alignment marks 720. In this illustration, the targeted area 740 on a metal 1 line is outlined by the CAD program. The ion mill operates at this targeted area 740. In this way, the targeted area 740 is easily located with respect to the alignment marks 720. The targeted area 740 may be at any metal level. However, it is most difficult to accurately locate specific features at the lowest metal level.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense. The present invention should not be construed as limited by such embodiments and examples, but rather construed according to the following claims.

What is claimed is:

1. A method of aligning an integrated circuit comprising the steps of:
    aligning said integrated circuit in an imaging tool based on a plurality of alignment marks disposed in a regular pattern throughout a surface of said integrated circuit; and
    locating underlying features of said integrated circuit based on a relationship of the underlying features to the plurality of alignment marks.

2. The method of claim 1 wherein said plurality of alignment marks are disposed in an equal geometric relationship.

3. The method of claim 1 wherein an alignment mark comprises a hole in a metal layer.

4. The method of claim 3 wherein said hole in said metal layer is approximately 2 microns wide and 2 microns long.

5. The method of claim 1 wherein an alignment mark comprises a notch in a side of a metal layer.

6. The method of claim 5 wherein said notch in said metal layer is approximately 0.5 microns wide and 1.5 microns long.

7. The method of claim 1 wherein an alignment mark comprises a tab on a side of a metal layer.

8. The method of claim 7 wherein said tab on the side of said metal layer is approximately 1.5 microns long and 0.5 microns wide.

9. The method of claim 1, further comprising the step of operating on said underlying features of said integrated circuit with a secondary electron emission (SEM) based imaging tool.

10. The method of claim 9, wherein the step of operating on said underlying features comprises one or more of the steps of: isolating an underlying line, reconnecting said underlying line, rerouting said underlying line, redepositing said underlying line, or testing an underlying node.

11. A method of making an alignment pattern on an integrated circuit having a number of layers and a top insulating layer, said method comprising the steps of:
    depositing a surface metal layer on said top insulating layer; and
    etching back said surface metal layer to produce at least one metal line and a plurality of alignment marks disposed throughout the integrated circuit, wherein said plurality of alignment marks are part of said at least one metal line.

12. The method of claim 11 wherein an alignment mark of said plurality of alignment marks comprises a hole within said metal line.

13. The method of claim 11 wherein an alignment mark of said plurality of alignment marks comprises a notch in a side of a metal line.

14. The method of claim 11 wherein an alignment mark of said plurality of alignment marks comprises a tab on a side of a metal line.

15. A method for aligning an integrated circuit that includes a substrate, a plurality of features on the substrate, a top insulating layer, and metal lines on the top insulating layer, the method comprising the steps of:
    aligning the integrated circuit based on a plurality of alignment marks disposed in a regular pattern on the metal lines throughout a surface of the integrated circuit; and
    locating the features underneath the top insulating layer of the integrated circuit based on a relationship of the underlying features to the plurality of alignment marks.

16. A method for manufacturing alignment marks on an integrated circuit comprising the steps of:
    depositing a surface metal layer on a top insulating layer of the integrated circuit that includes a plurality of underlying features; and
    etching back the surface metal layer to produce at least one metal line and a plurality of alignment marks, wherein said plurality of alignment marks are part of said at least one metal line, the alignment marks are disposed throughout the integrated circuit and the alignment marks are for locating the underlying features of the integrated circuit.

17. The method of claim 16 wherein said plurality of alignment marks are disposed in an equal geometric relationship.

18. The method of claim 17, wherein the equal geometric relationship comprises the alignment marks arranged in a square pattern.

19. The method of claim 17, wherein the equal geometric relationship comprises a parallelogram having an alignment mark at each corner.

20. The method of claim 16, wherein a width of the metal line determines a type of alignment mark used.

* * * * *